(12) United States Patent
Lee

(10) Patent No.: US 7,468,298 B2
(45) Date of Patent: Dec. 23, 2008

(54) METHOD OF MANUFACTURING FLASH MEMORY DEVICE

(75) Inventor: Jung Woong Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 212 days.

(21) Appl. No.: 11/489,392

(22) Filed: Jul. 19, 2006

(65) Prior Publication Data
US 2007/0122973 A1    May 31, 2007

(30) Foreign Application Priority Data
Nov. 28, 2005   (KR) .................... 10-2005-0114032

(51) Int. Cl.
*H01L 21/338* (2006.01)
(52) U.S. Cl. .................. 438/257; 257/E21.546

(58) Field of Classification Search .............. 438/257, 438/259, 264, 265, 424, 425
See application file for complete search history.

(56) References Cited

U.S. PATENT DOCUMENTS

2003/0054608 A1*  3/2003  Tseng et al. ................ 438/257

\* cited by examiner

*Primary Examiner*—Charles D Garber
*Assistant Examiner*—Reema Patel
(74) *Attorney, Agent, or Firm*—Marshall, Gerstein & Borun LLP

(57) ABSTRACT

A method of manufacturing a flash memory device, wherein, when a first polysilicon layer is formed, a doped polysilicon layer and an amorphous polysilicon layer are formed so that they are laminated. A process of forming a sidewall oxide film and an oxide film and a thermal treatment process are performed to form the profile of the first polysilicon layer negatively. It is therefore possible to prevent the remnants of the first polysilicon layer below the isolation film. Accordingly, a failure in which the floating gates adjacent in the direction of the isolation film are connected by the remnants of the first polysilicon layer can be prevented.

5 Claims, 2 Drawing Sheets

METHOD OF MANUFACTURING FLASH MEMORY DEVICE

BACKGROUND

1. Field of the Invention

The invention relates generally to a method of manufacturing a memory device and, more particularly, to a method of manufacturing a flash memory device, wherein the profile of a polysilicon layer for a floating gate is formed negatively.

2. Discussion of Related Art

In a flash memory device of 70 nm or less, an isolation film formation process is described as follows.

A tunnel oxide film, a first polysilicon layer for a floating gate, a nitride film, and a SiON layer are sequentially formed on a semiconductor substrate. The SiON layer, the nitride film, the first polysilicon layer, the tunnel oxide film, and a portion of the semiconductor substrate are sequentially etched by photolithography and etch processes employing a mask, thereby forming trench.

A sidewall oxide film is formed on surfaces of the trench and a high-density plasma (HDP) oxide film is then formed on the entire structure. The HDP oxide film is polished until a top surface of the nitride film is exposed, thereby forming an isolation film. The nitride film is stripped. At this time, when the first polysilicon layer is etched, the profile of the first polysilicon layer has a positive slope form. The profile of the first polysilicon layer has a clearer positive slope form by sidewall oxide film and HDP oxide film formation process (i.e., a subsequent process).

A second polysilicon layer for a floating gate is formed on the entire structure. The second polysilicon layer is etched by means of photolithography and etch processes employing a mask, thereby forming a floating gate including the first polysilicon layer and the second polysilicon layer. A dielectric layer and a conductive layer for a control gate are then formed on the entire structure. The conductive layer, the dielectric layer, and the second and first polysilicon layers are patterned to form the control gate vertical to the isolation film.

If the gates are formed as described above, however, a portion of the first polysilicon layer extends below the isolation film when they are etched. Accordingly, the first polysilicon layer remains at both sidewall edges of the isolation film due to etch-stop by the isolation film when the gates are etched. As a result, the floating gates adjacent in the direction of the isolation film are interconnected. Accordingly, failure is generated and the reliability of the device is lowered.

Meanwhile, since the first polysilicon layer has a positive profile form, the critical dimension (CD) of the active region is increased. As the pattern becomes finer, the margin of the photo process is shortened and a phenomenon in which the pattern collapses or is twisted upon etch is generated.

SUMMARY OF THE INVENTION

In one embodiment, the invention provides a method of manufacturing a flash memory device, wherein the profile of a polysilicon layer for a floating gate is formed negatively so that the polysilicon layer for the floating gate does not extend below the isolation film and polysilicon layer remnants can be prevented when etching gates.

A method of manufacturing a flash memory device according to the invention includes the steps of forming a first polysilicon layer in which a tunnel oxide film, a doped polysilicon layer, and an amorphous polysilicon layer are laminated on a semiconductor substrate, and etching the first polysilicon layer, the tunnel oxide film, and a portion of the semiconductor substrate to form a trench; forming a sidewall oxide film on a surface within the trench, forming an oxide film on the entire structure so that the trench is buried, and then performing a thermal treatment process so that the first polysilicon layer has a negative profile; and, polishing the oxide film so that the oxide film is formed only within the trench, thereby forming an isolation film.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will be described in detail in connection with certain exemplary embodiments with reference to the accompanying drawings.

Figure 1A:
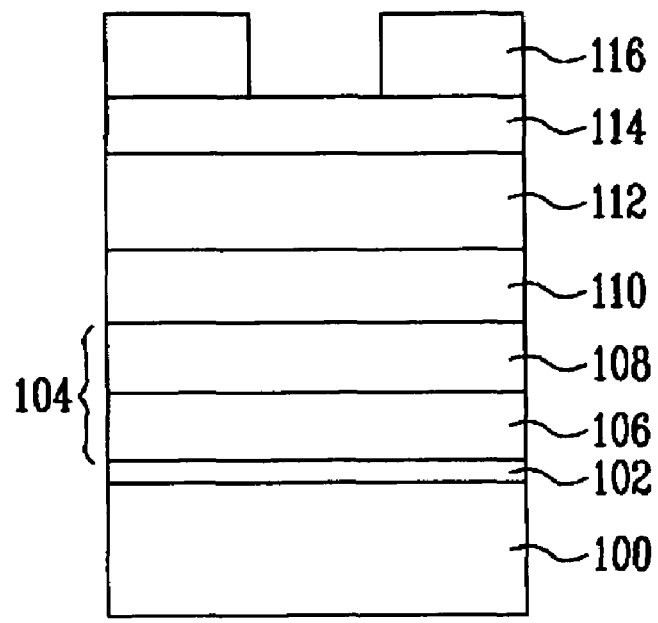
FIGS. 1A to 1C are cross-sectional views illustrating a method of manufacturing a flash memory device according to an embodiment of the invention.
Figure 1B:
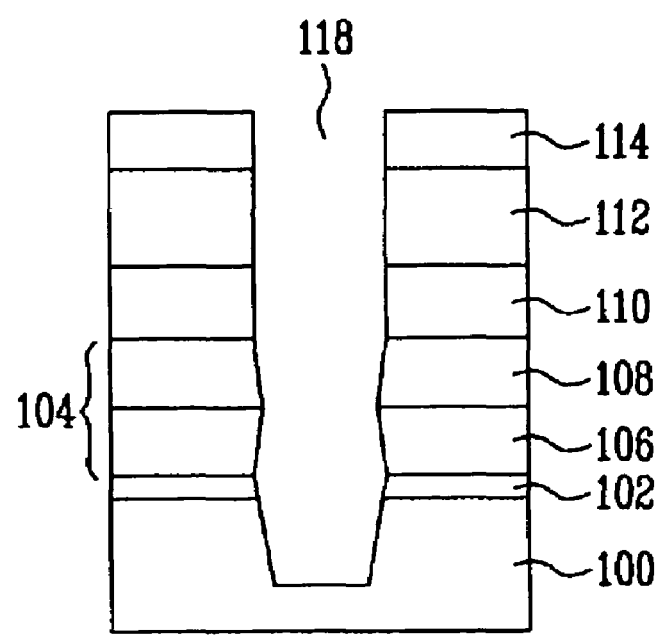
Figure 1C:
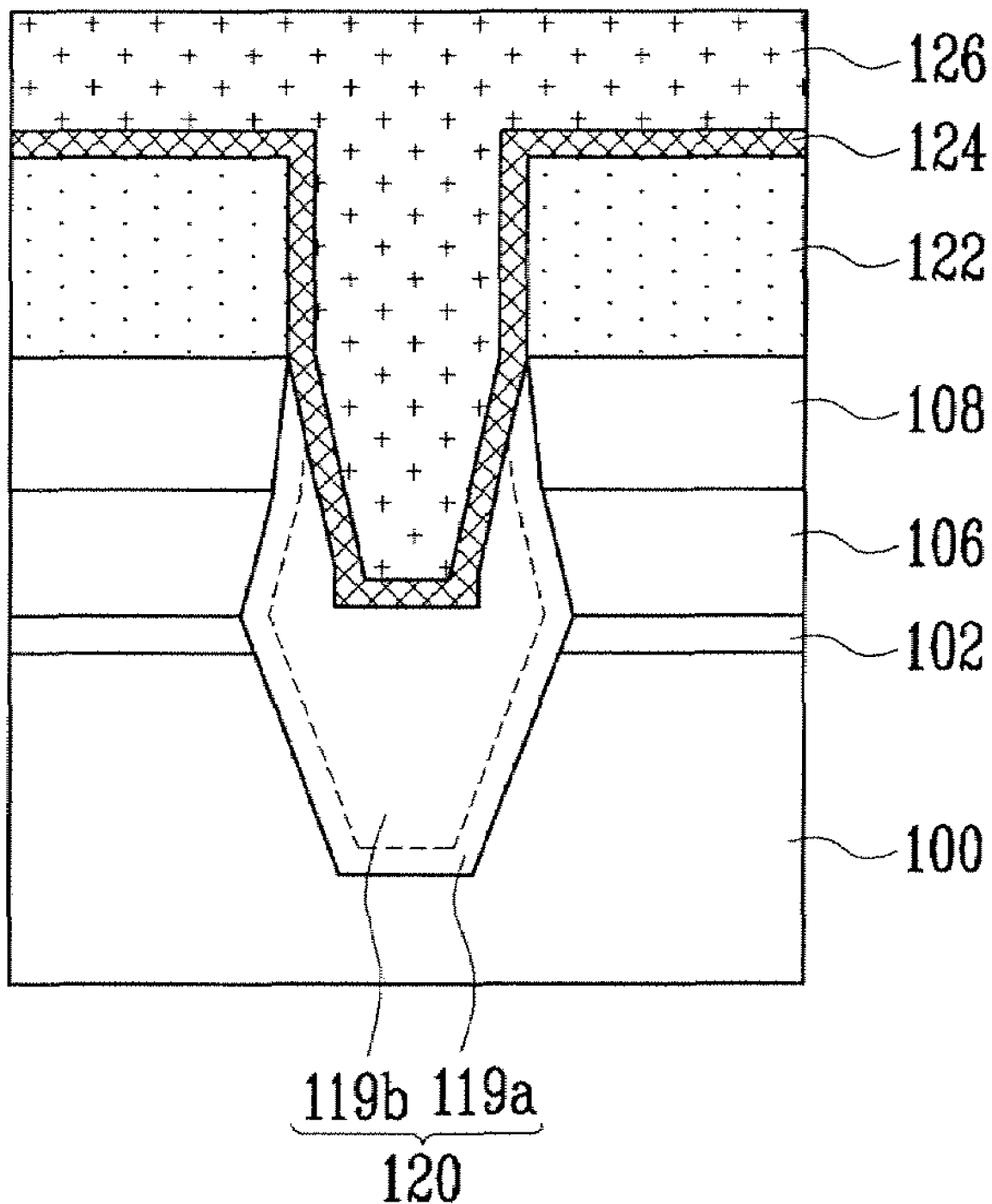

FIGS. 1A to 1C are cross-sectional views illustrating a method of manufacturing a flash memory device according to an embodiment of the invention.

Referring to FIG. 1A, a tunnel oxide film 102 and a first polysilicon layer 104 are sequentially formed on a semiconductor substrate 100. The first polysilicon layer 104 has a structure in which a doped polysilicon layer 106 and an amorphous polysilicon layer 108 are laminated and may preferably be formed to a thickness of 200 Å to 400 Å. The doped polysilicon layer 106 and the amorphous polysilicon layer 108 may preferably have a thickness ratio of 0.5:1 to 1:1 and may preferably be formed at a temperature of 550° C. to 580° C.

A nitride film 110, a hard mask film 112, an oxynitride film 114, and a photoresist pattern 116 are sequentially formed on the first polysilicon layer 104. The nitride film 110 has a structure in which $Si_3N_4$ or $Si_3N_4$ and $SiO_2$ are laminated.

Referring to FIG. 1B, the oxynitride film 114, the hard mask film 112, and the nitride film 110 are sequentially etched using the photoresist pattern 116 as a mask. The photoresist pattern 116 is then stripped. A portion of the first polysilicon layer 104, the tunnel oxide film 102, and the semiconductor substrate 100 are etched using the etched oxynitride film 114, the etched hard mask film 112, and the etched nitride film 110 as masks, thereby forming a trench 118.

In the process of etching the first polysilicon layer 104, the etch selectivity of the amorphous polysilicon layer 108 and the doped polysilicon layer 106 is preferably set to 3:1 to 5:1, a mixed gas, preferably of $Cl_2$, HBr, $CF_4$, and $O_2$, is introduced, preferably at a pressure of 5 mT to 20 mT, and a source power, preferably of 200 W to 500 W, and a bias power preferably of 50 W to 200 W, are used.

If the process is performed as described above, the amorphous polysilicon layer 108 has a positive slope form and the doped polysilicon layer 106 has a negative slope form, due to the difference in the etch rate between the amorphous polysilicon layer 108 and the doped polysilicon layer 106.

Referring to FIG. 1C, a sidewall oxide film 119a is formed on a surface within the trench 118. After a HDP oxide film 119b is formed on the entire structure so that the trench 118 is buried, a thermal treatment process is carried out. During the process of forming the sidewall oxide film and the HDP oxide film and the thermal treatment process, the amorphous polysilicon layer 108 and the doped polysilicon layer 106 within the trench 118 are oxidized. An oxide film formed in the amorphous polysilicon layer 108 is relatively thin and the oxide film formed in the doped polysilicon layer 106 is relatively thick. Accordingly, the profile of the first polysilicon layer 104 is formed negatively.

Thereafter, the oxynitride film 114, the hard mask film 112, and the HDP oxide film are polished until the top surface of the nitride film 110 is exposed, thereby forming an isolation film 120. The nitride film 110 is stripped.

A second polysilicon layer 122 is formed on the entire structure. The second polysilicon layer 122 is etched by means of photolithography and etch processes employing a mask, thus forming a floating gate consisting of the first polysilicon layer 104 and the second polysilicon layer 122.

A dielectric layer 124 and a conductive layer 126 are formed on the entire structure. The dielectric layer 124 and the conductive layer 126 are patterned using the conductive layer 126, the dielectric layer 124, the second polysilicon layer 122, and the first polysilicon layer 104 as etch masks, thus forming a control gate in a direction vertical to the isolation film 120.

The profile of the first polysilicon layer 104 is formed negatively. Accordingly, the first polysilicon layer 104 does not extend below the isolation film 120. Therefore, when etching the gates, the remnants of the first polysilicon layer 104 below the isolation film 120 can be prevented.

As described above, according to the invention, when the first polysilicon layer is formed, the doped polysilicon layer and the amorphous polysilicon layer are formed so that they are laminated. The process of forming the sidewall oxide film and the oxide film and the thermal treatment process are performed to form the profile of the first polysilicon layer negatively. It is therefore possible to prevent the remnants of the first polysilicon layer below the isolation film. Accordingly, a failure in which the floating gates adjacent in the direction of the isolation film are connected by the remnants of the first polysilicon layer can be prevented.

Furthermore, since the first polysilicon layer has a negative profile form, the CD of the active region can be reduced.

Accordingly, the shortage of the margin of the photo process and the collapse of the pattern, which occur due to a fine pattern, can be improved.

While the invention has been described in connection with practical exemplary embodiments the invention is not limited to the disclosed embodiments but, to the contrary, is intended to cover various modifications and equivalent arrangements included within the spirit and scope of the appended claims.

What is claimed is:

1. A method of manufacturing a flash memory device, the method comprising:
   forming a tunnel oxide film on a semiconductor substrate;
   forming a first polysilicon layer in which a doped polysilicon layer and an amorphous polysilicon layer are laminated on the tunnel oxide film;
   etching the first polysilicon layer, the tunnel oxide film, and a portion of the semiconductor substrate to form a trench;
   forming a sidewall oxide film on a surface within the trench, forming an oxide film on the entire structure so that the trench is buried, and then performing a thermal treatment process so that the first polysilicon layer has a negative profile; and
   polishing the oxide film so that the oxide film is formed only within the trench, forming an isolation film.

2. The method of claim 1, comprising forming the first polysilicon layer to a thickness of 200 Å to 400 Å.

3. The method of claim 1, wherein the doped polysilicon layer and the amorphous polysilicon layer have a thickness ratio of 0.5:1 to 1:1, and comprising forming the doped polysilicon layer and the amorphous polysilicon layer at a temperature of 550° C. to 580° C.

4. The method of claim 1, wherein the amorphous polysilicon layer and the doped polysilicon layer have an etch selectivity of 3:1 to 5:1.

5. The method of claim 1, comprising performing the etch process of the first polysilicon layer using a mixed gas of $Cl_2$, HBr, $CF_4$, and $O_2$ at a pressure of 5 mT to 20 mT, and using a source power of 200 W to 500 W and a bias power of 50 W to 200 W.

* * * * *